(12) United States Patent
Liao et al.

(10) Patent No.: US 10,170,492 B2
(45) Date of Patent: Jan. 1, 2019

(54) MEMORY DEVICE AND METHOD FOR FABRICATING THE SAME

(71) Applicant: MACRONIX INTERNATIONAL CO., LTD., Hsinchu (TW)

(72) Inventors: Ting-Feng Liao, New Taipei (TW); Yi-Chen Wang, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/481,676

(22) Filed: Apr. 7, 2017

(65) Prior Publication Data

US 2018/0294273 A1    Oct. 11, 2018

(51) Int. Cl.
| | |
|---|---|
| *H01L 27/115* | (2017.01) |
| *H01L 27/11556* | (2017.01) |
| *H01L 23/522* | (2006.01) |
| *H01L 23/528* | (2006.01) |
| *H01L 23/532* | (2006.01) |
| *G11C 16/04* | (2006.01) |

(52) U.S. Cl.
CPC .... *H01L 27/11556* (2013.01); *G11C 16/0408* (2013.01); *H01L 23/5226* (2013.01); *H01L 23/5283* (2013.01); *H01L 23/53204* (2013.01); *H01L 23/53295* (2013.01)

(58) Field of Classification Search
CPC .......... H01L 27/1158; H01L 27/11582; H01L 27/11568; H01L 27/1157
See application file for complete search history.

(56) References Cited

U.S. PATENT DOCUMENTS

| | | | |
|---|---|---|---|
| 7,586,149 B2 | 9/2009 | Yoon et al. | |
| 9,036,421 B2 | 5/2015 | Liu | |
| 9,406,692 B2 | 8/2016 | Lee | |
| 9,431,417 B1 | 8/2016 | Lai et al. | |
| 9,805,805 B1* | 10/2017 | Zhang | G11C 16/14 |
| 2014/0063890 A1 | 3/2014 | Lee et al. | |
| 2015/0194435 A1 | 7/2015 | Lee | |
| 2015/0340376 A1* | 11/2015 | Park | H01L 27/11582 |
| | | | 257/329 |
| 2016/0343450 A1 | 11/2016 | Lee et al. | |

OTHER PUBLICATIONS

TIPO Office Action dated Mar. 9, 2018 issued in Taiwan application (No. 106111665).

* cited by examiner

*Primary Examiner* — Allison P Bernstein
(74) *Attorney, Agent, or Firm* — McClure, Qualey & Rodack, LLP

(57) ABSTRACT

A memory device includes a semiconductor substrate, a first conductive layer, a plurality of second conductive layers, a plurality insulating layers, at least one contact plug and at least one dummy plug. The first conductive layer is disposed on the semiconductor substrate. The insulating layers are disposed on the first conductive layer. The second conductive layers are alternatively stacked with the insulating layers and insulated from the first conductive layer. The contact plug passes through the insulating layers and the second conductive layers, insulates from the second conductive layers and electrically contacts to the first conductive layer. The dummy plug, corresponds to the at least one contact plug, passes through the insulating layers and the second conductive layers, and insulates from the second conductive layers and the first conductive layer.

8 Claims, 14 Drawing Sheets

MEMORY DEVICE AND METHOD FOR FABRICATING THE SAME

BACKGROUND

Technical Field

The disclosure of the present disclosure generally relates to a non-volatile memory (NVM) device and the method for fabricating the same, and more particularly to a three-dimensional (3D) NVM and the method for fabricating the same.

Description of the Related Art

An NVM device which is able to continually store information even when the supply of electricity is removed from the device containing the NVM cell has been widespreadly adopted by bulk solid state memory applications in the art.

The method for fabricating an NVM device, such as a vertical channel NAND flash memory device having a vertical channel, generally includes steps as follows: A multilayers stack configured by a plurality of insulating layers and a plurality of conductive layers alternatively stacked with each other is firstly provided on a semiconductor substrate. At least one through hole or trench is then formed in the multilayers stack, and a memory layer with silicon-oxide-nitric-oxide-silicon (SONOS) structure and a poly-silicon channel layer are formed in sequence on the sidewalls of the through hole/trench, whereby a plurality of memory cells are defined at the intersection points formed by the SONOS memory layer, the channel layer and the poly-silicon layers, and electrically connected to a bottom common source line (CSL) formed in the semiconductor substrate through the channel layer. Therein after, at least one contact plug passing through the multilayers stack may be formed to electrically connect the CSL to a source control circuit through an interconnection disposed on the multilayers stack.

However, as more conductive layers are integrated into the multilayers stack to satisfy the requirement of high memory density, the stress resulted either from the process for fabricating the contact plugs or from the material difference between two adjacent ones of the conductive layer and the insulating layer of the multilayers stack may be significant increased. The increased stress may deform the through holes passing though the multilayers stack, the contact plugs formed in the through holes may be bent, and the reliability of the NVM device thus may be thus deteriorated by the bent contact plugs.

Therefore, there is a need of providing a memory device and the method for fabricating the same to obviate the drawbacks encountered from the prior art.

SUMMARY

In one Embodiment of the present disclosure, a memory device is disclosed, wherein the memory device includes a semiconductor substrate, a first conductive layer, a plurality of second conductive layers, a plurality insulating layers, at least one contact plug and at least one dummy plug. The first conductive layer is disposed on the semiconductor substrate. The insulating layers are disposed on the first conductive layer. The second conductive layers are alternatively stacked with the insulating layers and insulated from the first conductive layer. The contact plug passes through the insulating layers and the second conductive layers, insulates from the second conductive layers and electrically contacts to the first conductive layer. The dummy plug, corresponds to the at least one contact plug, passes through the insulating layers and the second conductive layers, and insulates from the second conductive layers and the first conductive layer.

In accordance with another embodiment of the present disclosure, a method for fabricating a memory device is provided, wherein the method includes steps as follows: Firstly, a multilayers stack having a plurality of insulating layers and a plurality of material layers alternatively stacked with each other is provided on a first conductive layer, to make the first conductive layer isolated from the material layers. Next at least one dummy plug passing through the insulating layers and the material layers is formed to electrically isolate from the first conductive layer and the material layers. Subsequently, at least one contact plug corresponding to the at least one dummy plug is formed to pass through insulating layers and a plurality of material layers, electrically isolate from the material layers and electrically contact to the first conductive layer.

In accordance with the aforementioned embodiments of the present disclosure, a memory device and method for fabricating the same are provided. A multilayers stack having a plurality of insulating layers and a plurality of second conductive layers are formed on a first conductive layer. A memory layer and a channel layer passing through the multilayers stack are formed, so as to define a plurality of memory cells on the intersection points of the memory layer, the channel layer and the second conductive layers. Prior to the forming of at least one contact plug that is formed in the multilayers stack and electrically contacting to the first conductively, a dummy plug is formed in the multilayers stack corresponding the predetermined position for form the contact plug.

Because the material for configuring the dummy plug is different from that for configuring the contact plug. The dummy plug that is formed prior to the contact plug, in some embodiments of the present disclosure, may have a stiffness substantially less than that of the contact plug to serve as a stress buffer for releasing the stress resulted from the process for fabricating the contact plug. In some other embodiment, the dummy plug may have a stiffness substantially greater than that of the contact plug to serve as an anchor for resisting the stress resulted from the material difference between two adjacent ones of the conductive layers and the insulating layers, so as to provide a more stable condition and a greater process window for forming the contact plug in the multilayers stack subsequently. As a result, the problems due to the aforementioned stress can be avoided, and the operation reliability of the memory device can be improved.

The above objects and advantages of the present disclosure will become more readily apparent to those ordinarily skilled in the art after reviewing the following detailed description and accompanying drawings, in which:

DETAILED DESCRIPTION

Figure 1A:
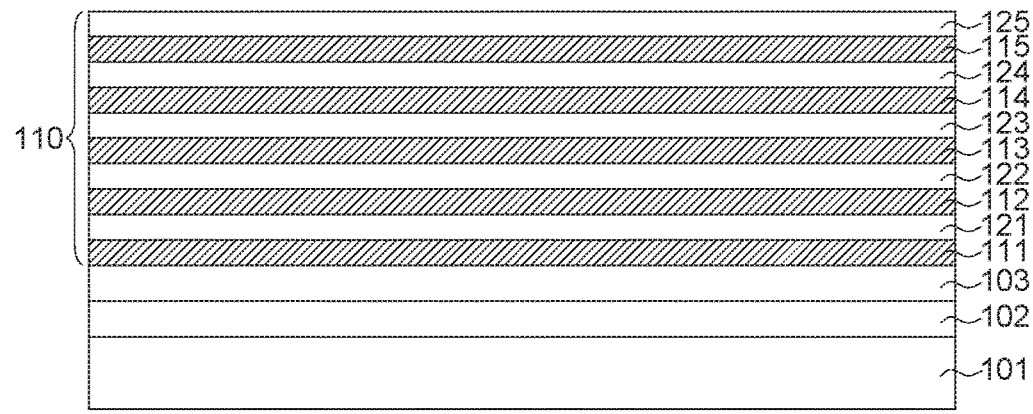
FIGS. 1A to 1K are cross-sectional views illustrating the processing structures for forming a memory device in accordance with one embodiment of the present disclosure.

The embodiments as illustrated below provide a memory device and the method for fabricating the same to improve its operation reliability. The present disclosure will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1K are cross-sectional views illustrating the processing structures for forming a memory device 100 in accordance with one embodiment of the present disclosure. In the present embodiment, the memory device 100 is a vertical channel NAND flash memory device. The method for fabricating the memory device 100 includes steps as follows:

Firstly, a first conductive layer 102 is formed on a semiconductor substrate 101; an isolation layer 103 is then formed on the first conductive layer 102; and a multilayers stack 110 is provided on the isolation layer 103 (see FIG. 1A). In some embodiments of the present disclosure, the semiconductor substrate 101 may be made of a p-type doped, n-type doped or undoped semiconductor material, such as poly-silicon, germanium (Ge) or any other suitable semiconductor material. The first conductive layer 102 may be made of conductive material, such as poly-silicon, doped semiconductor material, metal or the arbitrary combinations thereof. In some other embodiments, the first conductive layer 102 may be an ion implantation layer formed in the semiconductor substrate 101. In the present embodiment, the semiconductor substrate 101 is made of p-type doped poly-silicon; and the first conductive layer 102 is made of n-type doped poly-silicon. The isolation layer 103 may be a silicon oxide layer having a thickness about 500 angstrom (Å).

The multilayers stack 110 includes a plurality of insulating layers 121-125 and a plurality of sacrificing layers 111-115 formed on the isolation layer 103. The insulating layers 121-125 and the sacrificing layers 111-115 are parallel to each other and alternatively stacked on the isolation layer 103 along the Z axle as shown in FIG. 1A. In the present embodiment, the sacrificing layers 111 and the insulating layer 125 respectively serve as the bottommost layer and the top-most layer of the multilayers stack 110, wherein the sacrificing layers 111 is directly in contact with the isolation layer 103. In other words, the sacrificing layers 111-115 are electrically isolated from the first conductive layer 102 by the isolation layer 103 and the insulating layers 121-125.

In some embodiments of the present disclosure, the sacrificing layers 111-115 and the insulating layers 121-125 may be both formed by a low pressure chemical vapor deposition (LPCVD), however, the material for configuring the sacrificing layers 111-115 may be different from that for configuring can made of silicon-nitride compounds, such as SiN, SiON, silicon carbonitride (SiCN), or the arbitrary combinations thereof. The insulating layers 121-125 may be made of dielectric material other than the material made of the sacrificing layers 111-115, such as silicon oxide, silicon carbide (SiC), silicate or the arbitrary combinations thereof. In the present embodiment, the sacrificing layers 111-115 are made of SiN with a thickness about 520 Å, and the insulating layers 121-125 are made of silicon dioxide ($SiO_2$) with a thickness about 280 Å.

Figure 1B:
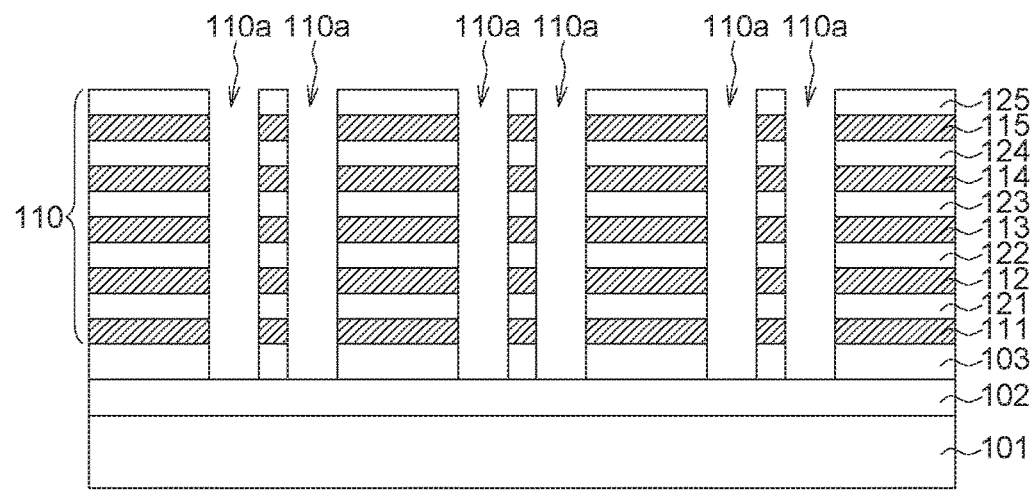

Next, an etching process is performed to form a plurality of first through openings 110a passing through the multilayers stack 110 and the isolation layer 103, so as to expose a portion of the first conductive layer 102 (see FIG. 1B). In some embodiments of the present disclosure, the etching process can be an anisotropic etching process, such as a reactive ion etching (RIE) process, performed on the multilayers stack 110 using a patterned hard mask layer (not shown) as an etching mask. The first through openings 110a may be a plurality of through holes passing through the multilayers stack 110 and the isolation layer 103 along the Z axle used to expose a portion of the semiconductor substrate 101 serving as the bottom of the through openings 110a and to expose portions of the sacrificing layers 111-115, the insulating layers 121-126 and the isolation layer 103 serving as the sidewalls of the first through openings 110a.

Figure 1C:
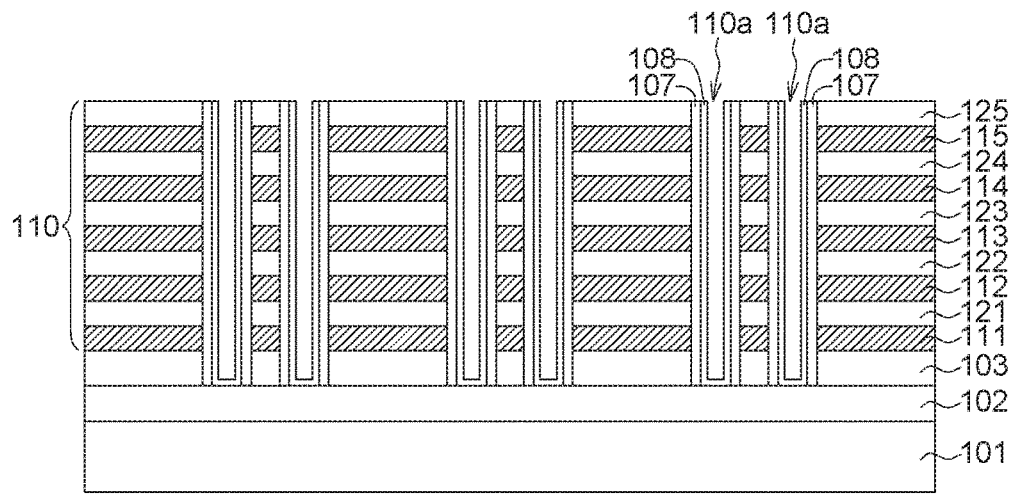

Next, a memory layer 107 and a channel layer 108 are formed in sequence on sidewalls of the first through opening 110a to make the memory layer 107 disposed between the channel layer 108 and the remaining sacrificing layers 111-115 (see FIG. 1C). In some embodiments of the present disclosure, the forming of the memory layer 107 includes steps as follows: a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure is firstly formed to conformally blanket over the multilayers stack 110, the sidewalls and the bottoms of the first through openings 110a. An etching process is then performed to remove portions of the composite layer having ONO, ONONO or ONONONO structure disposed on the top surface of the multilayers stack 110 and the bottoms of the first through opening 110a, so as to expose portions of the first conductive layer 102.

Thereafter, a deposition process is performed to form the channel layer 108 made of semiconductor material, such as such as silicon (Si), Ge or other doped/undoped semiconductor material, to blanket over the memory layer 107 and the exposed portions of the first conductive layer 102. In the present embodiment, the channel layer 108 is made of undoped poly-silicon. After the forming of the channel layer 108, the first through openings 110a are filled by a dielectric material 109, such as silicon dioxide ($SiO_2$). After the dielectric material 109 is etched back, a bond pad 116 may be formed on the dielectric material 109 to form an electrical contact with the channel layer 108, and a clapping layer 117 is then provide to cover the bond pad 1116 and the multilayers stack 110 (see FIG. 1D). In the present embodiment, the clapping layer 117 includes silicon oxide.

Subsequently, another etching process is performed to form at least one second through opening 118 passing through the multilayers stack 110 along the Z axle from the top surface of the multilayers stack 110, so as to partially expose the sacrificing layers 111-115, the insulating layers 121-125 and the top surface of the first conductive layer 102 (see FIG. 1E). In some embodiments of the present disclosure, the at least one second through opening 118 can be a plurality of slits passing through the multilayers stack 110.

Figure 1D:
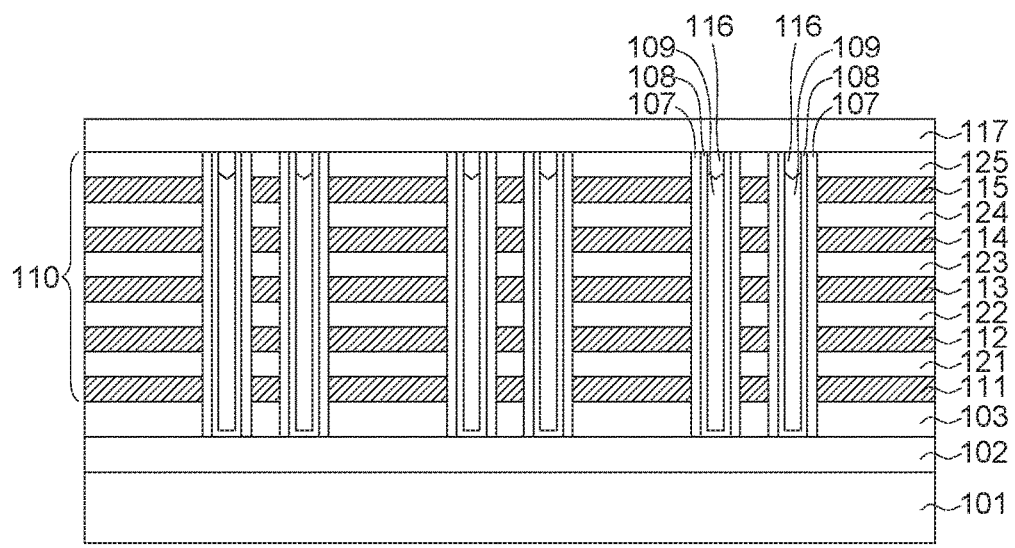
Figure 1E:
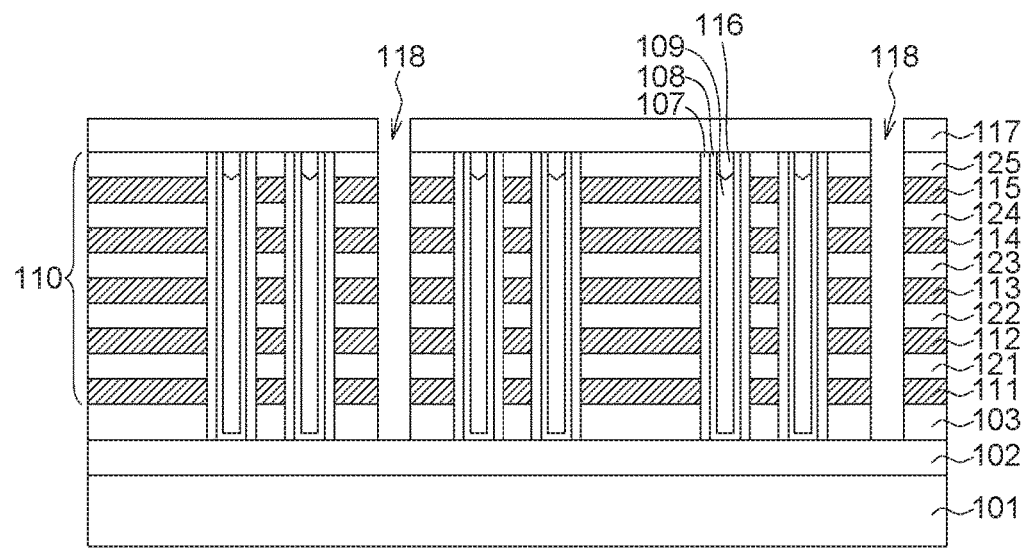
Figure 1F:
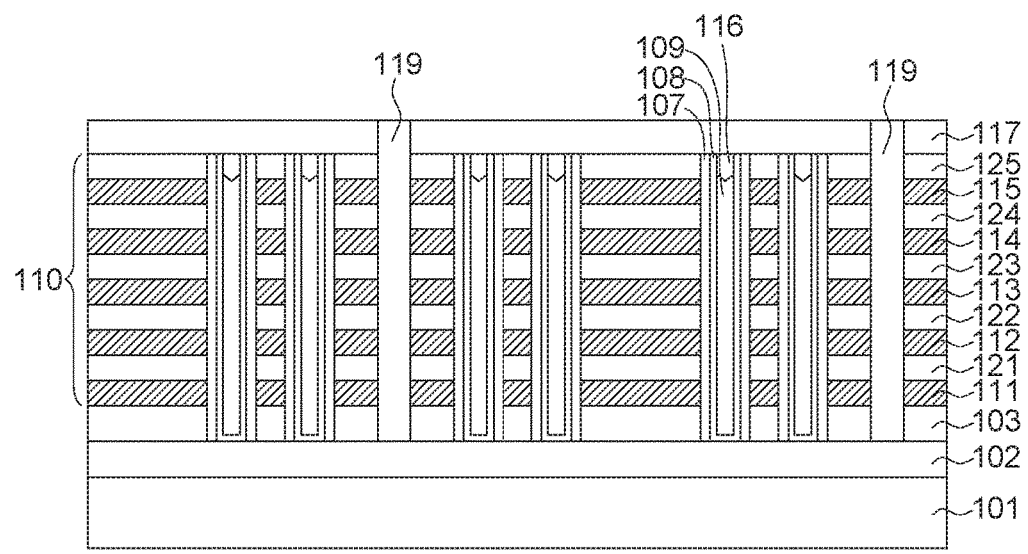

The second through openings 118 are then full filled by dielectric material other than the dielectric material used for forming the sacrificing layers 111-115, so as to form a dummy plug 119 in each of the second through openings 118 (see FIG. 1F). In some embodiments of the present disclosure, the dielectric material for configuring the dummy plugs 119 can be silicon oxide, SiC, silicate or the arbitrary combinations thereof.

Figure 1G:
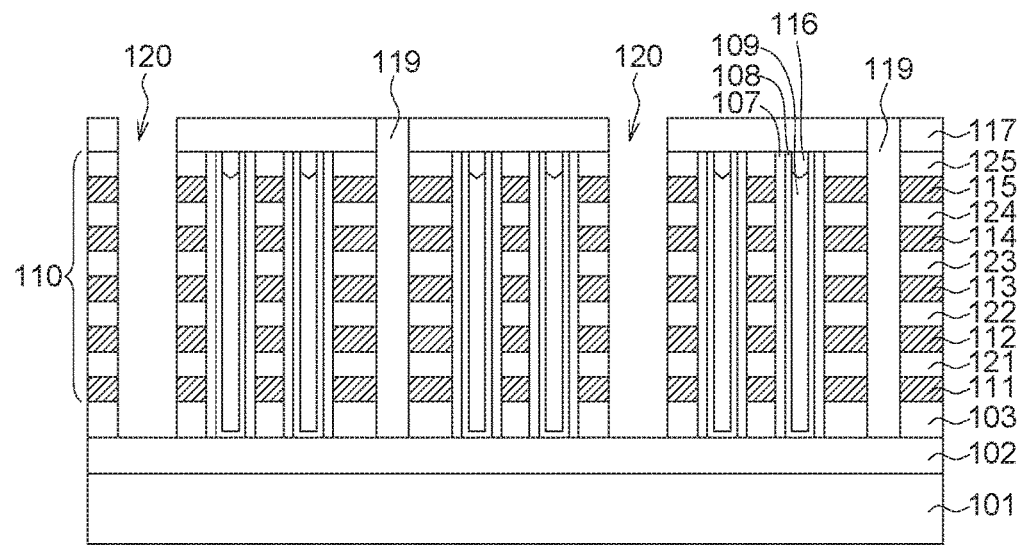
Figure 1H:
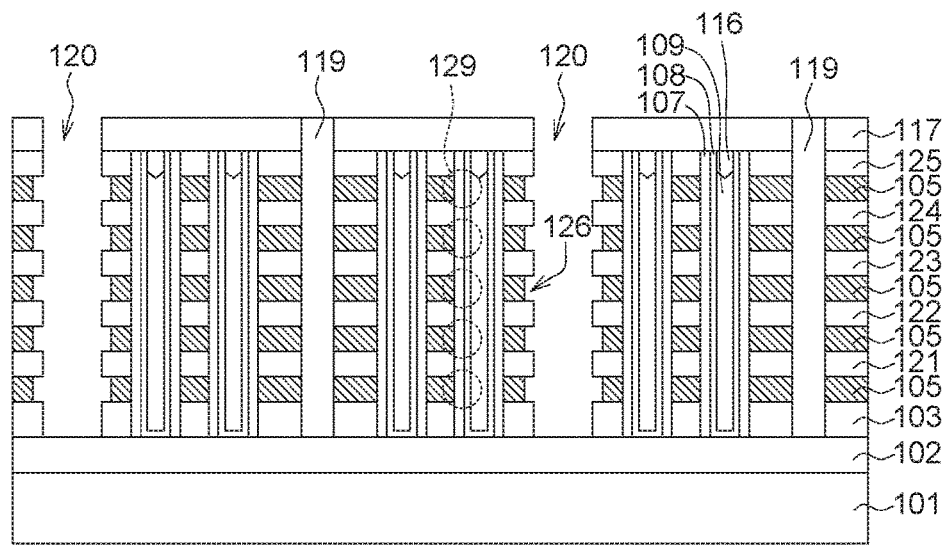
Figure 1I:
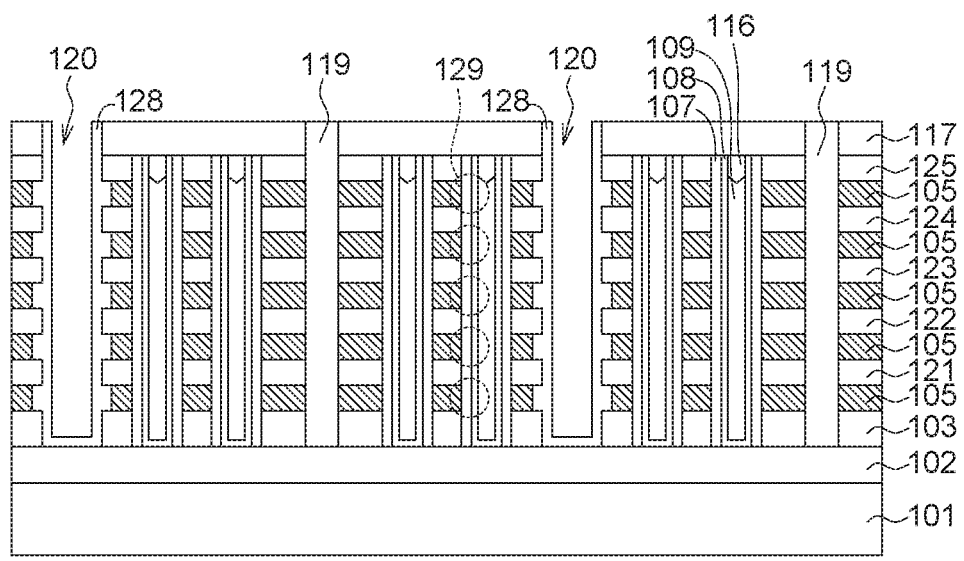
Figure 1J:
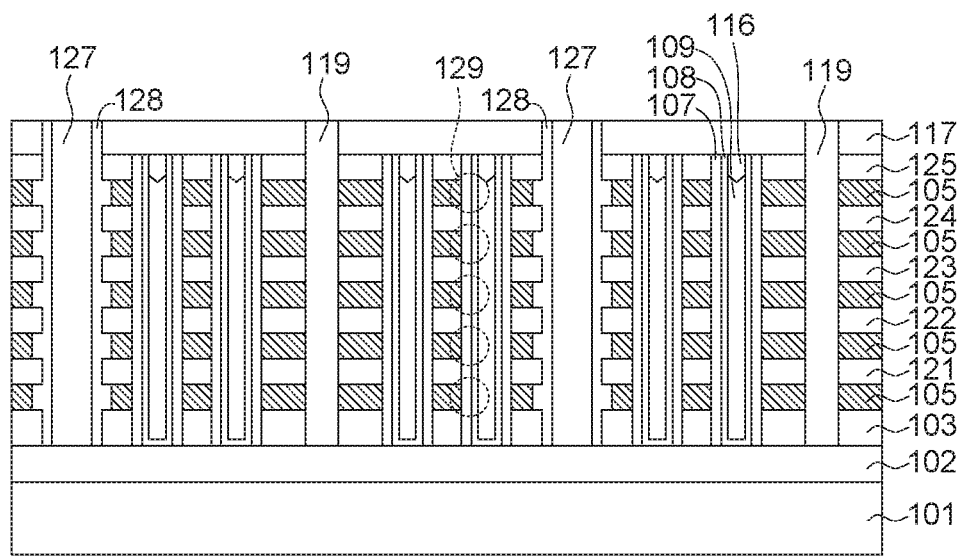

Yet another etching process is then performed to form at least one third through opening 120 passing through the multilayers stack 110 along the Z axle from the top surface of the multilayers stack 110, so as to partially expose the sacrificing layers 111-115, the insulating layers 121-125 and the top surface of the first conductive layer 102 (see FIG. 1G). In some embodiments of the present disclosure, the at least one third through opening 120 can be a plurality of slits passing through the multilayers stack 110, wherein each of the third through openings 120 has a width substantial greater than that of the second through opening 118, and the position of each third through openings 120 is corresponding to the position on which at least one of the second through openings 118 (the dummy plus 119) is formed.

The remaining sacrificing layers 111-115 is then removed. In the present embodiment, phosphoric acid ($H_3PO_4$) solution is utilized to remove the remaining sacrificing layers 111-115 through the third through openings 120, so as to form a plurality of recesses 126 between the insulating layers 121-125 and the isolation layer 103 to expose portions of the memory layer 107. Next, a plurality of second conductive layers 105 are formed on the positions (the recess 126) where the remaining sacrificing layers 111-115 initially occupied. As a result, a plurality of memory cells 129 can be defined at the intersection points of the second conductive layers 105, the memory layer 107 and the channel layer 108, so as to form a memory cell array in the multilayers stack 110 (see FIG. 1H). In some embodiments of the present disclosure, the second conductive layers 105 may be made by poly-silicon, metal or other suitable conductive material. In the present embodiment, the second conductive layers 105 are a plurality metal layers made of tungsten (W). In some embodiments, prior to the forming of the second conductive layers 105, a high-dielectric-constant (high-K) gate dielectric layer made of aluminum oxide ($Al_2O_3$) (not shown) may be formed by an LPCVD process on the sidewalls of the recess 126 defined by the insulating layers 121-125 and the memory layer 107.

After the forming of the second conductive layers 105, a dielectric spacer 128 is then formed on the sidewalls of the third through openings 120. In some embodiments of the present disclosure, the forming of the dielectric spacer 128 includes steps as follows: Epitaxial silicon is firstly grown in the third through openings 120 and the recesses 126 by a deposition process; and a low temperature oxidation (LTO) process is then performed under an operation temperature ranging from 300° C. to 450° C. with reaction gases to form a silicon oxide layer on the sidewalls and the bottom of the third through openings 120, meanwhile the recesses 126 are fulfilled by the silicon oxide layer (see FIG. 1I).

The third through openings 120 are then fulfilled by a conductive material, such as metal (e.g. titanium (Ti), W, Aluminum (Al), copper (Cu), gold (Au), silver (Ag) or the alloys of these metals), metal oxide (e.g. titanium nitride (TiN)) or other suitable material, after the portions of the dielectric spacer 128 disposed on the bottom of the third through openings 120, so as to form a contact plug 127 electrically isolated from the second conductive layers 105 by the dielectric spacer 128, and electrically contacting to the first conductive layer 102 in each of the third through openings 120.

Figure 1K:
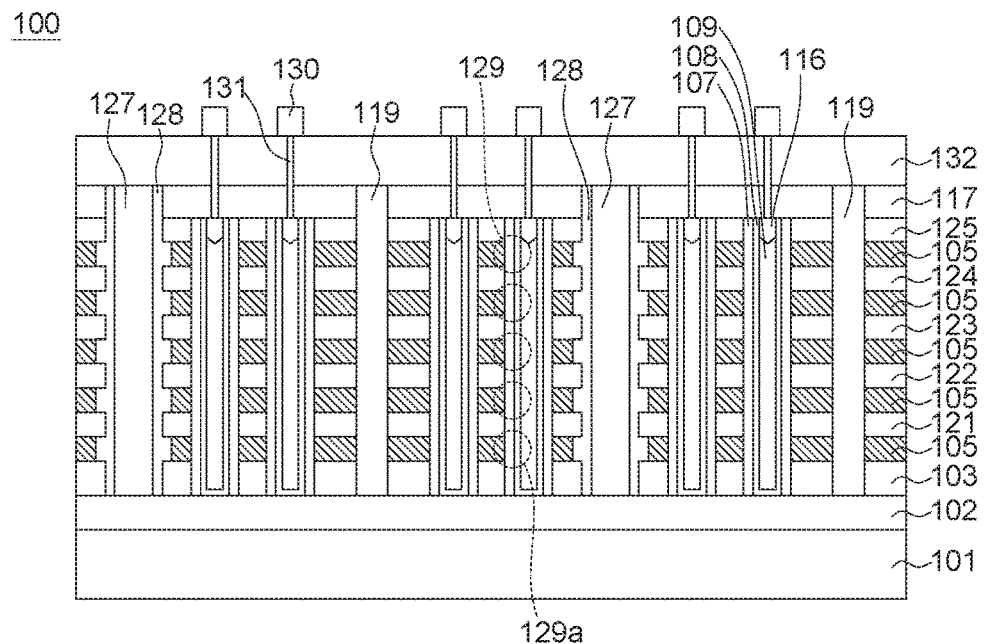

After a series back end of line (BEOL) processes are carried out, an inter-layer dielectric (ILD) 132 is then formed on the clapping layer 117; a plurality of bit lines 130 electrically connected to the bond pad 116 with an interconnection via 131 are formed on the ILD 132. Meanwhile, the memory device 100 as shown in FIG. 1K can be accomplished. In some embodiments of the present disclosure, the memory cells 129a defined by the bottommost layer of the second conductive layers 105, the memory layer 107 and the channel layer 108 can serve as ground selection transistors (GST) of the memory device 100; the first conductive layer 102 can serve as the bottom common source line of the memory device 100; and other memory cells 129 of the memory cell array can be electrically coupled to a decoder, such as a row decoder or a column decoder (not shown), through the bit lines 130.

Because the material for configuring the dummy plugs 119 is different from that for configuring the contact plugs 127. The dummy plugs 119 that are formed prior to the contact plugs 127, in some embodiments of the present disclosure, may have a stiffness substantially less than that of the contact plugs 127 to serve as a stress buffer for releasing the stress resulted from the process for fabricating the contact plugs 127. In some other embodiment, the dummy plugs 119 may have a stiffness substantially greater than that of the contact plug to serve as an anchor for resisting the stress resulted from the material difference between two adjacent ones of the second conductive layers 105 and the insulating layer 121-125, so as to provide a more stable condition and a greater process window for forming the contact plugs 127 in the multilayers stack 110 subsequently. As a result, the problems due to the aforementioned stress can be avoided, and the operation reliability of the memory device 100 can be improved.

Figure 2A:
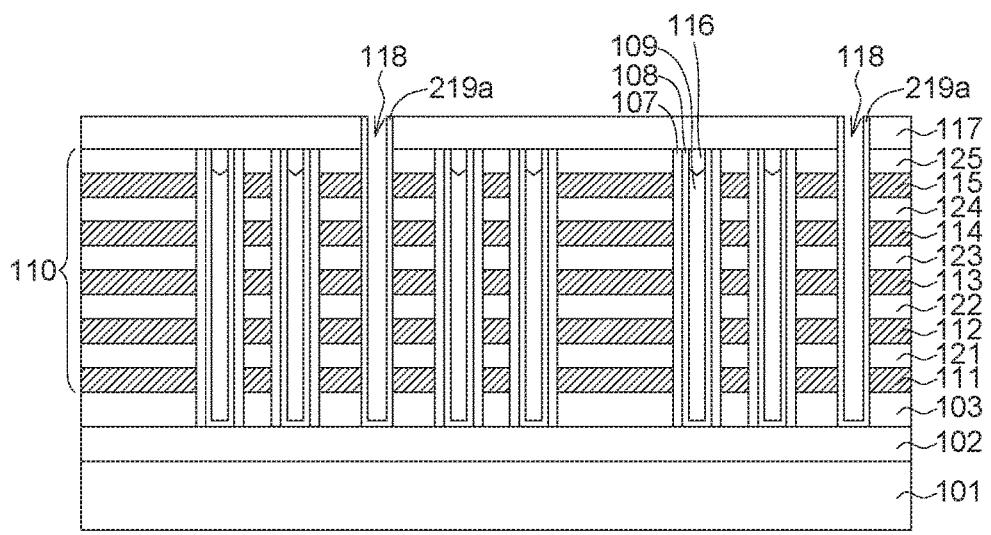
FIGS. 2A to 2C are cross-sectional views illustrating a portion of the processing structures for forming a memory device in accordance with another embodiment of the present disclosure.
Figure 2B:
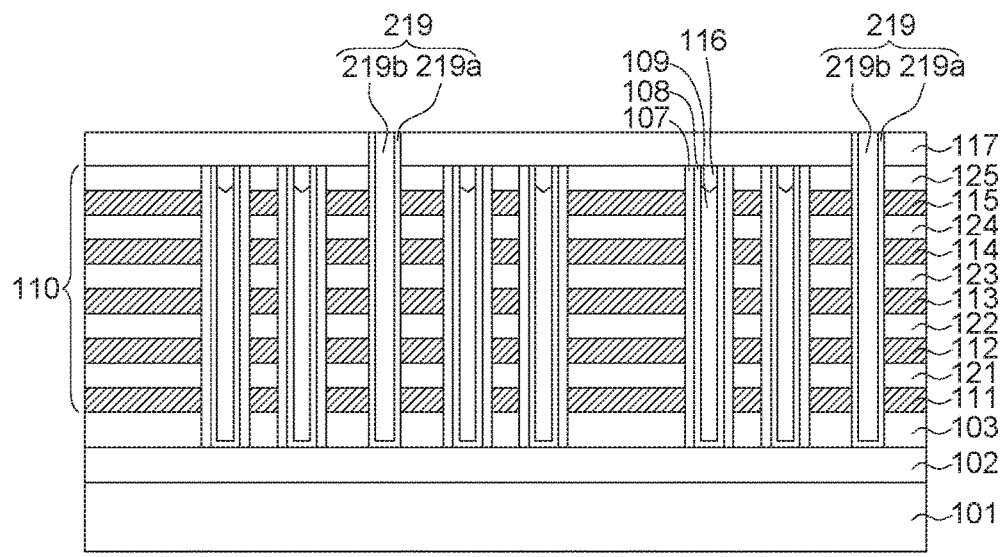
Figure 2C:
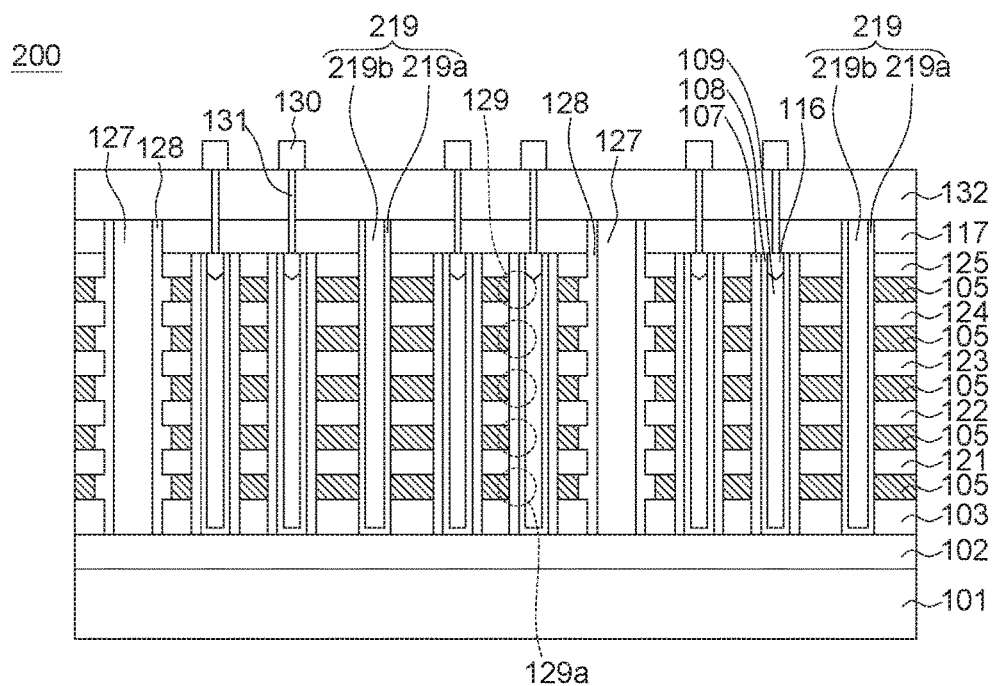

FIGS. 2A to 2C are cross-sectional views illustrating a portion of the processing structures for forming a memory device 200 in accordance with another embodiment of the present disclosure. In the present embodiment, the memory device 200 is a vertical channel NAND flash memory device. The method for fabricating the memory device 200 is similar to that for fabricating the memory device 100, except the process and material for forming the dummy plugs 219. Since the other elements common to that of the memory device 100 has be disclosed in the processes as depicted in FIGS. 1A to 1K, thus the common processes for forming the common elements will not be redundantly described. Mere the process for forming the dummy plugs 219 is detailed described below.

The process for forming the dummy plugs 219 starts from the structure as depicted in FIG. 1E and includes steps as follows: An dielectric isolation layer 219a is firstly formed on the sidewalls of the second openings 118 as depicted in FIG. 1E (see FIG. 2A). Next, the second openings 118 are fulfilled by a conductive material 219b other than that for configuring the subsequently formed contact plugs 127 to form a dummy plug 219 in each of the second openings 118, wherein the remaining sacrificing layers 111-115 are electrically isolated from the conductive material 219b by the dielectric isolation layer 219a (see FIG. 2B). Subsequently, the processes as depicted in FIGS. 1G to 1K are carried out on the structure of FIG. 2B to form the memory as shown in FIG. 2C.

In the present embodiment, the conductive material 219b includes poly-silicon. Because the material for configuring the dummy plugs 219 that are formed prior to the contact plugs 127 have a stiffness substantially less than that of the contact plugs 127. The dummy plugs 219 can serve as a stress buffer for releasing the stress resulted from the process for fabricating the contact plugs 127, so as to provide a greater process window for forming the contact plugs 127 in the multilayers stack 110 subsequently. As a result, the problems due to the aforementioned stress can be avoided, and the operation reliability of the memory device 200 can be improved.

FIGS. 3A to 3E are cross-sectional views illustrating a portion of the processing structures for forming a memory device 300 in accordance with yet another embodiment of the present disclosure. In the present embodiment, the memory device 300 is a vertical channel NAND flash memory device. The method for fabricating the memory device 200 is similar to that for fabricating the memory device 100, except the process and material for forming the dummy plugs 319 and the contact plugs 327. Since the other elements common to that of the memory device 100 has be disclosed in the processes as depicted in FIGS. 1A to 1D, thus the common processes for forming the common elements will not be redundantly described. Mere the processes for forming the dummy plugs 319 and the contact plugs 327 are detailed described below.

The processes for forming the dummy plugs 319 and the contact plugs 327 start from the structure as depicted in FIG. 1D and includes steps as follows: An etching process is performed on the structure as depicted in FIG. 1D to form at least one second through opening 318 and at least one third through opening 320 passing through the multilayers stack 110 along the Z axle from the top surface of the multilayers stack 110, so as to partially expose the sacrificing layers 111-115, the insulating layers 121-125 and the top surface of the first conductive layer 102 respectively (see FIG. 3A). In some embodiments of the present disclosure, the at least one second through opening 318 can be a plurality of slits passing through the multilayers stack 110; and the at least one third through opening 320 can be a plurality of slits passing through the multilayers stack 110, wherein each of the third through openings 320 has a width substantial greater than that of the second through opening 318, and the position of each third through openings 320 is corresponding to the position on which at least one of the second through openings 318 is formed.

The remaining sacrificing layers 111-115 is then removed. In the present embodiment, $H_3PO_4$ solution is utilized to remove the remaining sacrificing layers 111-115 through the second through opening 318 and the third through openings 320, so as to so as to form a plurality of recesses 326 between the insulating layers 121-125 and the isolation layer 103 to expose portions of the memory layer 107. Next, a plurality of second conductive layers 105 are formed on the positions (the recess 326) where the remaining sacrificing layers 111-115 initially occupied. As a result, a plurality of memory cells 129 can be defined at the intersection points of the second conductive layers 105, the memory layer 107 and the channel layer 108, so as to form a memory cell array in the multilayers stack 110 (see FIG. 3B). In some embodiments of the present disclosure, the second conductive layers 105 may be made by poly-silicon, metal or other suitable conductive material. In the present embodiment, the second conductive layers 105 are a plurality metal layers made of W. In some embodiments, prior to the forming of the second conductive layers 105, a high-K gate dielectric layer made of $Al_2O_3$ (not shown) may be formed by an LPCVD process on the sidewalls of the recess 326 defined by the insulating layers 121-125 and the memory layer 107.

After the forming of the second conductive layers 105, a deposition process, such as LPCVD, is performed to deposit dielectric material in the second trough openings 318 and the third through openings 320 in a manner of fulfilling the second trough openings 318 to form a dummy plug 319 in each of the second trough openings 318 and forming a dielectric spacer 328 on the sidewalls of the third through openings 320. In some embodiments of the present disclosure, the forming of the dummy plug 319 and the dielectric spacer 328 includes steps as follows: Epitaxial silicon is firstly grown in the second trough openings 318, the third through openings 320 and the recesses 326 by a deposition process; and an LTO process is then performed under an operation temperature ranging from 300° C. to 450° C. with reaction gases to form a silicon oxide layer fulfilling the second trough openings 318 and recesses 326 as well as covering on the sidewalls and the bottom of the third through openings 320, whereby the dummy plugs 319 are formed in the second trough openings 318 and the dielectric spacer 328 are formed to cover the sidewalls and the bottom of the third through openings 320 (see FIG. 3C). In some embodiments of the present disclosure, the material for configuring the dummy plugs 319 and the dielectric spacer 328 can be silicon oxide, SiC, silicate or the arbitrary combinations thereof.

Figure 3A:
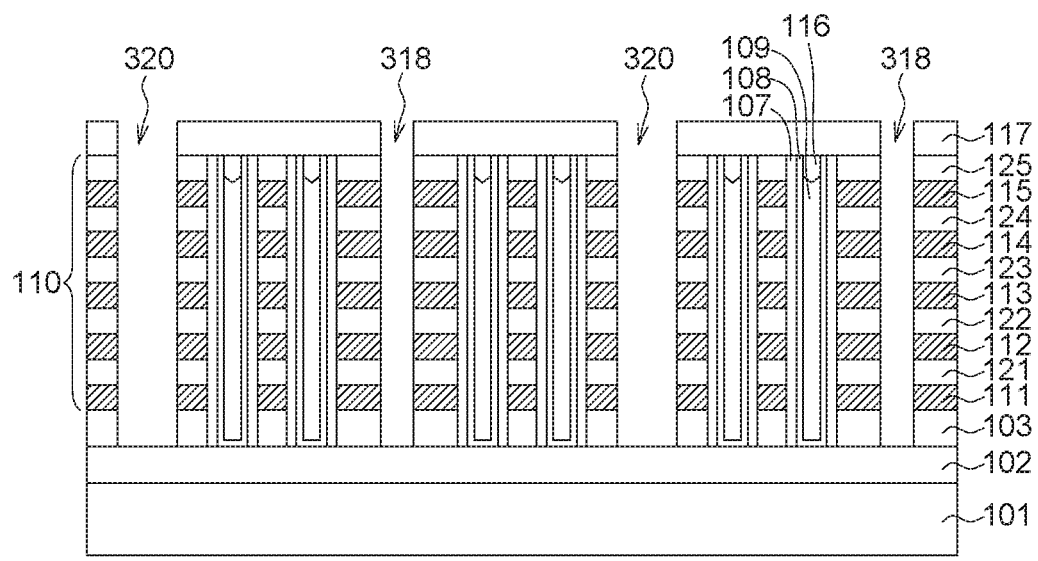
FIGS. 3A to 3E are cross-sectional views illustrating a portion of the processing structures for forming a memory device in accordance with yet another embodiment of the present disclosure.
Figure 3B:
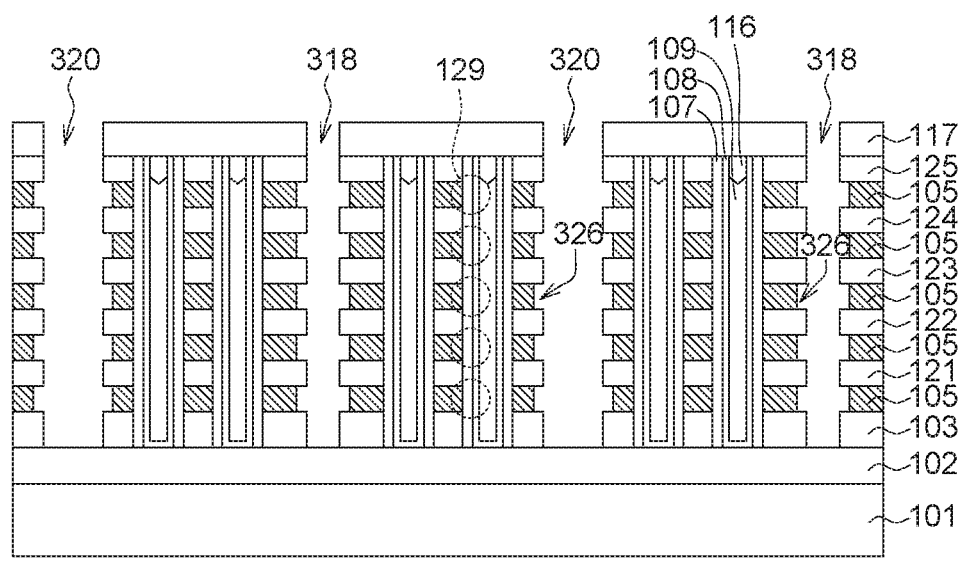
Figure 3C:
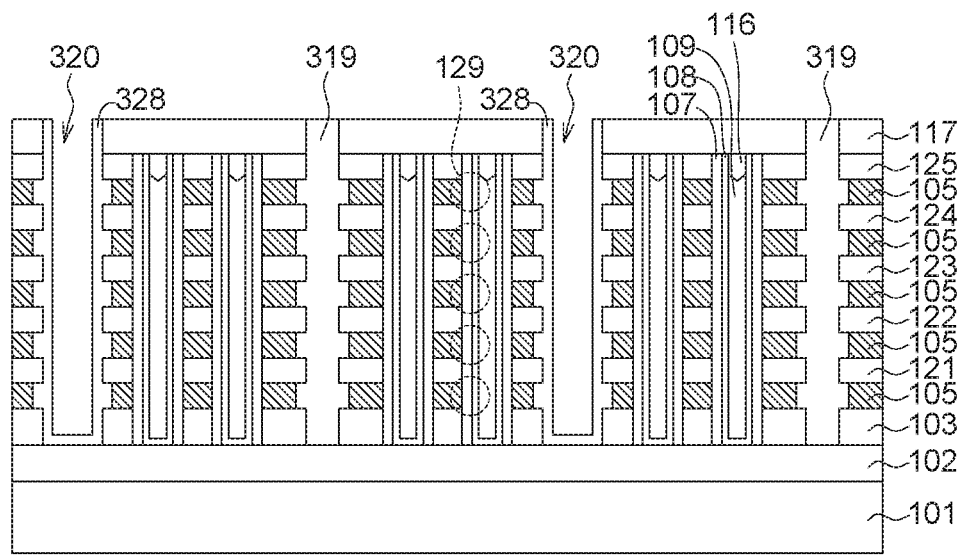
Figure 3D:
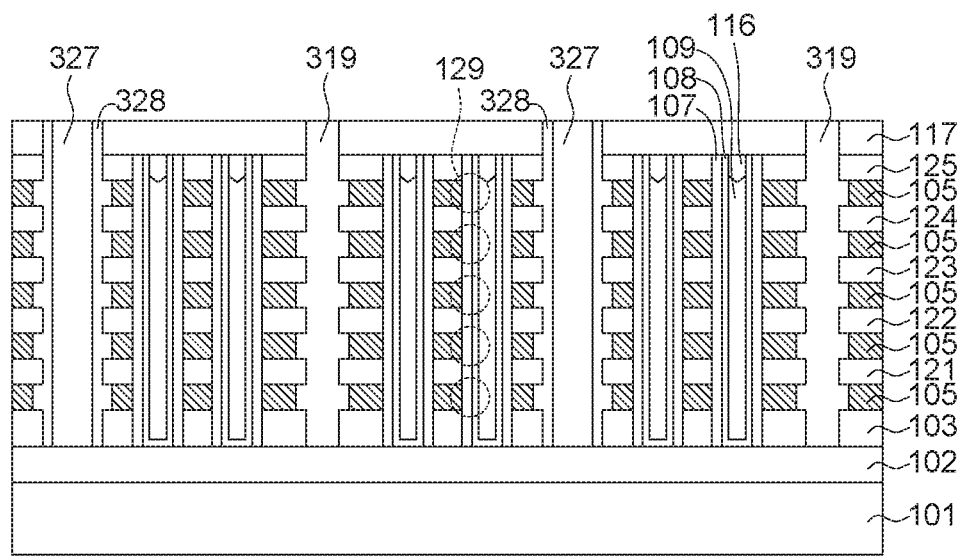

The third through openings 320 are then fulfilled by a conductive material, such as metal (e.g. Ti, W, Al, Cu, Au, Ag or the alloys of these metals), metal oxide (e.g. TiN) or other suitable material, after the portions of the dielectric spacer 328 disposed on the bottom of the third through openings 320, so as to form a contact plug 327 electrically isolated from the second conductive layers 105 by the dielectric spacer 328, and electrically contacting to the first conductive layer 102 in each of the third through openings 320 (see FIG. 3D).

Figure 3E:
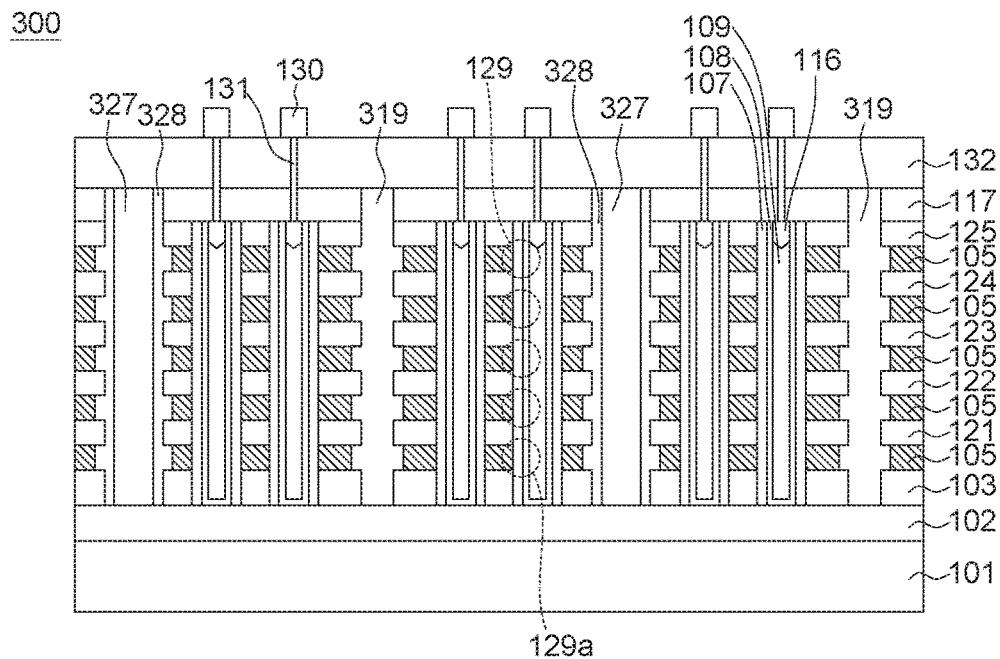

After a series BEOL processes are carried out, an ILD 132 is then formed on the clapping layer 117; a plurality of bit lines 130 electrically connected to the bond pad 116 with an interconnection via 131 are formed on the ILD 132. Meanwhile, the memory device 300 as shown in FIG. 3E can be accomplished. In some embodiments of the present disclosure, the memory cells 129a defined by the bottommost layer of the second conductive layers 105, the memory layer 107 and the channel layer 108 can serve as GST of the memory device 300; the first conductive layer 102 can serve as the bottom common source line of the memory device 300; and other memory cells 129 of the memory cell array can be electrically coupled to a decoder, such as a row decoder or a column decoder (not shown), through the bit lines 130.

Because the material for configuring the dummy plugs 319 is different from that for configuring the contact plugs 327. The dummy plugs 319 that are formed prior to the contact plugs 327, in some embodiments of the present disclosure, may have a stiffness substantially less than that of the contact plugs 327 to serve as a stress buffer for releasing the stress resulted from the process for fabricating the contact plugs 327. In some other embodiment, the dummy plugs 319 may have a stiffness substantially greater than that of the contact plug to serve as an anchor for resisting the stress resulted from the material difference between two adjacent ones of the second conductive layers 105 and the insulating layer 121-125, so as to provide a more stable condition and a greater process window for forming the contact plugs 327 in the multilayers stack 110 subsequently. As a result, the problems due to the aforementioned stress can be avoided, and the operation reliability of the memory device 300 can be improved.

FIGS. 4A to 4H are cross-sectional views illustrating the processing structures for forming a memory device 400 in accordance with yet another embodiment of the present disclosure. In the present embodiment, the memory device 400 is a vertical channel NAND flash memory device. The method for fabricating the memory device 400 includes steps as follows:

Firstly, a first conductive layer 102 is formed on a semiconductor substrate 101; an isolation layer 103 is then formed on the first conductive layer 102; and a multilayers stack 410 is provided on the isolation layer 103 (see FIG. 1A). In some embodiments of the present disclosure, the semiconductor substrate 101 may be made of a p-type doped, n-type doped or undoped semiconductor material, such as poly-silicon, Ge or any other suitable semiconductor material. The first conductive layer 102 may be made of conductive material, such as poly-silicon, doped semiconductor material, metal or the arbitrary combinations thereof. In some other embodiments, the first conductive layer 102 may be an ion implantation layer formed in the semiconductor substrate 101. In the present embodiment, the semiconductor substrate 101 is made of p-type doped poly-silicon; and the first conductive layer 102 is made of n-type doped poly-silicon. The isolation layer 103 may be a silicon oxide layer having a thickness about 500 Å.

Figure 4A:
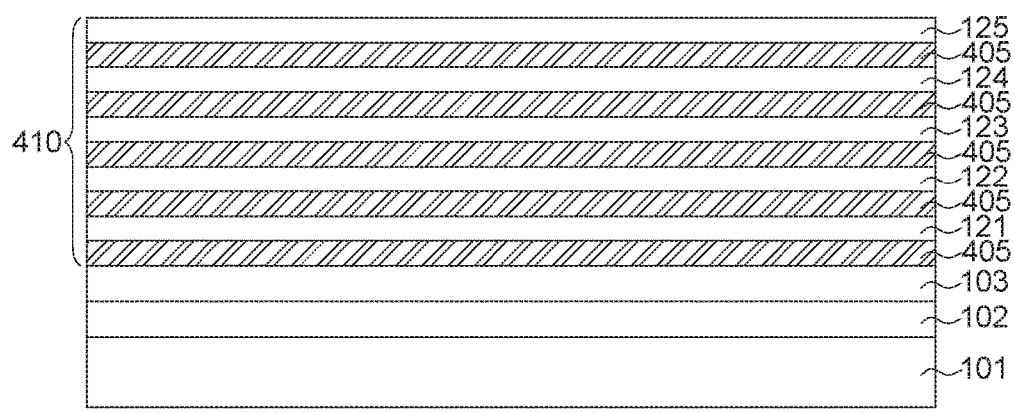
FIGS. 4A to 4H are cross-sectional views illustrating the processing structures for forming a memory device in accordance with yet another embodiment of the present disclosure.

The multilayers stack 410 includes a plurality of insulating layers 121-125 and a plurality of second conductive layers 405 formed on the isolation layer 103. The insulating layers 121-125 and the second conductive layers 405 are parallel to each other and alternatively stacked on the isolation layer 103 along the Z axle as shown in FIG. 4A. In the present embodiment, the insulating layer 125 serves as the top-most layer of the multilayers stack 110, and the bottommost one of the second conductive layers 405 is directly in contact with the isolation layer 103. In other words, the second conductive layers 405 are electrically isolated from the first conductive layer 102 by the isolation layer 103 and the insulating layers 121-125.

Figure 4B:
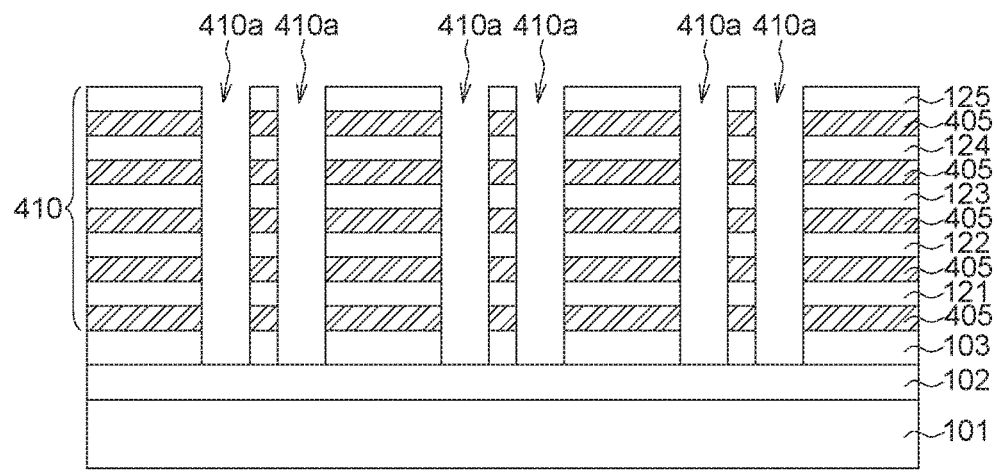

Next, an etching process is performed to form a plurality of first through openings 410a passing through the multilayers stack 410 and the isolation layer 103, so as to expose a portion of the first conductive layer 102 (see FIG. 4B). In some embodiments of the present disclosure, the etching process can be an anisotropic etching process, such as a RIE process, performed on the multilayers stack 410 using a patterned hard mask layer (not shown) as an etching mask. The first through openings 410a may be a plurality of through holes passing through the multilayers stack 410 and the isolation layer 103 along the Z axle used to expose a portion of the semiconductor substrate 101 serving as the bottom of the through openings 410a and to expose portions of the second conductive layers 405, the insulating layers 121-126 and the isolation layer 103 serving as the sidewalls of the first through openings 410a.

Figure 4C:
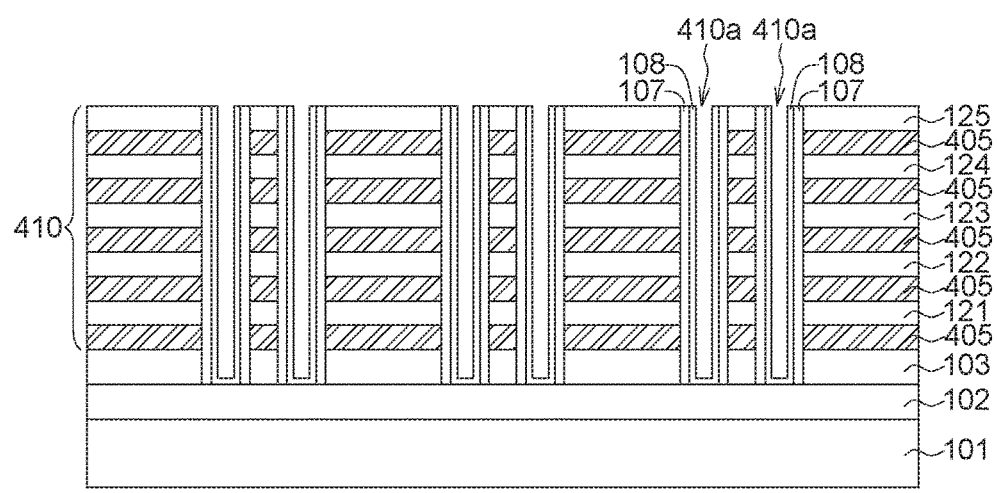
Figure 4D:
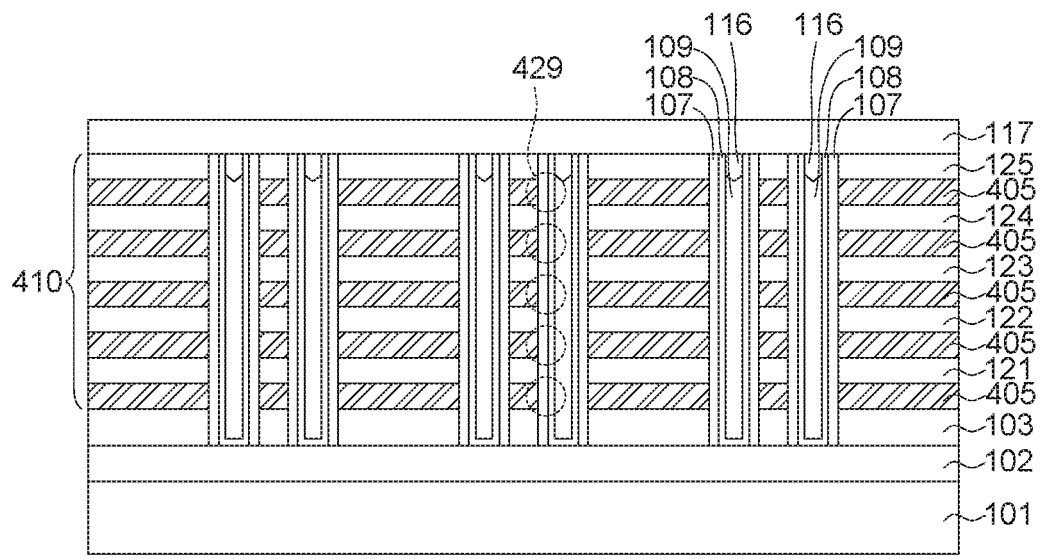

Next, a memory layer 107 and a channel layer 108 are formed in sequence on sidewalls of the first through opening 110a to make the memory layer 107 disposed between the channel layer 108 and the second conductive layers 405 (see FIG. 4C). In some embodiments of the present disclosure, the forming of the memory layer 107 includes steps as follows: a composite layer having (but not limited to) ONO, ONONO or ONONONO structure is firstly formed to conformally blanket over the multilayers stack 410, the sidewalls and the bottoms of the first through openings 410a. An etching process is then performed to remove portions of the composite layer having ONO, ONONO or ONONONO structure disposed on the top surface of the multilayers stack 410 and the bottoms of the first through opening 410a, so as to expose portions of the first conductive layer 102.

Thereafter, a deposition process is performed to form the channel layer 108 made of semiconductor material, such as such as Si, Ge or other doped/undoped semiconductor material, to blanket over the memory layer 107 and the exposed portions of the first conductive layer 102. As a result, a plurality of memory cells 429 can be defined at the intersection points of the second conductive layers 405, the memory layer 107 and the channel layer 108, so as to form a memory cell array in the multilayers stack 410. In the present embodiment, the channel layer 108 is made of undoped poly-silicon.

After the forming of the channel layer 108, the first through openings 410a are filled by a dielectric material 109, such as $SiO_2$. After the dielectric material 109 is etched back, a bond pad 116 may be formed on the dielectric material 109 to form an electrical contact with the channel layer 108, and a clapping layer 117 is then provide to cover the bond pad 116 and the multilayers stack 110 (see FIG. 4D). In the present embodiment, the clapping layer 117 includes silicon oxide.

Figure 4E:
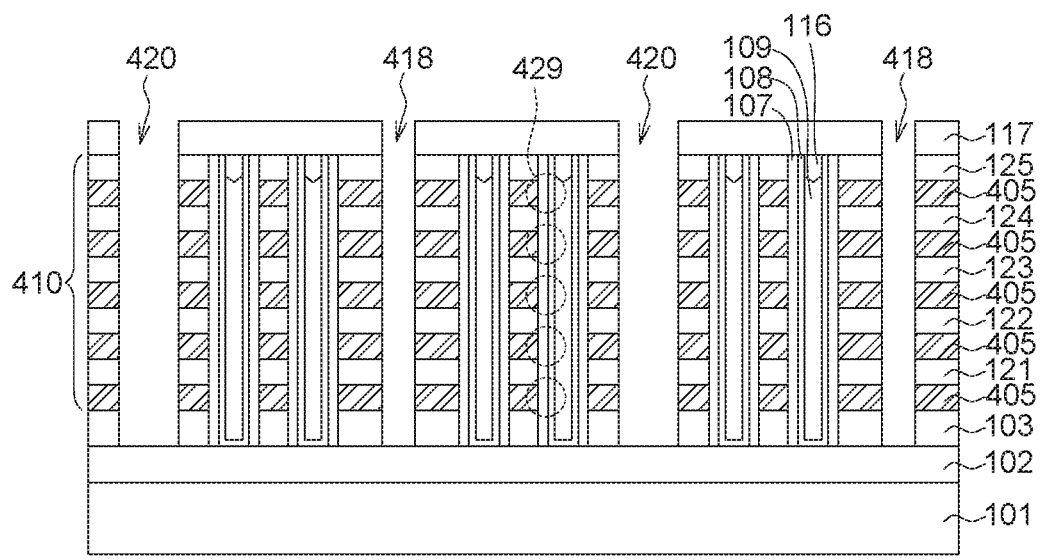
Figure 4F:
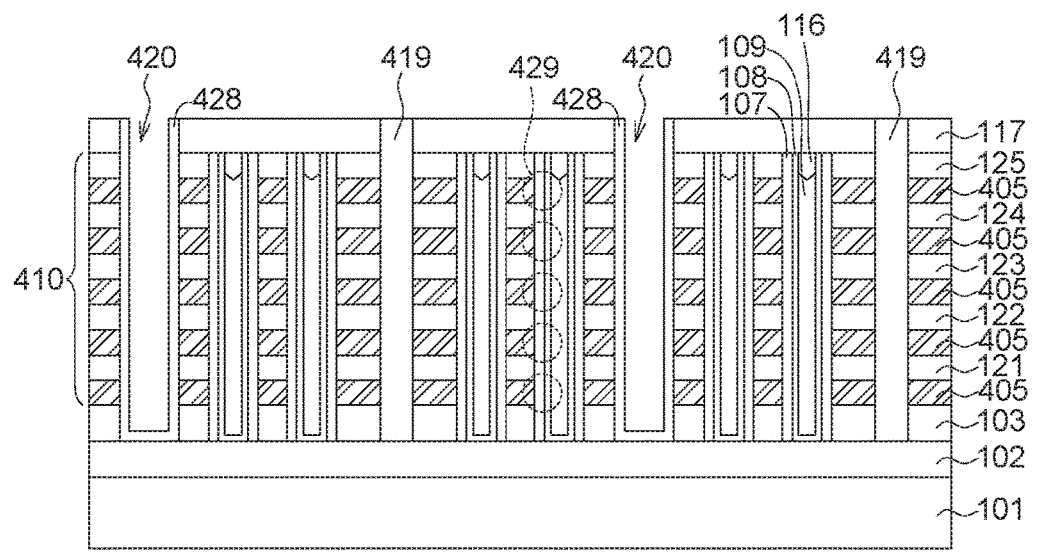

An etching process is performed to form at least one second through opening 418 and at least one third through opening 420 passing through the multilayers stack 410 along the Z axle from the top surface of the multilayers stack 410, so as to partially expose the second conductive layers 405, the insulating layers 121-125 and the top surface of the first conductive layer 102 respectively (see FIG. 4E). In some embodiments of the present disclosure, the at least one second through opening 418 can be a plurality of slits passing through the multilayers stack 410; and the at least one third through opening 420 can be a plurality of slits passing through the multilayers stack 410, wherein each of the third through openings 420 has a width substantial greater than that of the second through opening 418, and the position of each third through openings 420 is corresponding to the position on which at least one of the second through openings 418 is formed.

Next, a deposition process, such as LPCVD, is performed to deposit dielectric material in the second trough openings 418 and the third through openings 420 in a manner of fulfilling the second trough openings 418 to form a dummy plug 419 in each of the second trough openings 418 and forming a dielectric spacer 428 on the sidewalls of the third through openings 420. In some embodiments of the present disclosure, the forming of the dummy plug 419 and the dielectric spacer 428 includes steps as follows: Epitaxial silicon is firstly grown in the second trough openings 418 and the third through openings 420 by a deposition process; and an LTO process is then performed under an operation temperature ranging from 300° C. to 450° C. with reaction gases to form a silicon oxide layer fulfilling the second trough openings 418 and covering on the sidewalls and the bottom of the third through openings 420, whereby the dummy plugs 419 are formed in the second trough openings 418 and the dielectric spacer 428 are formed to cover the sidewalls and the bottom of the third through openings 420 (see FIG. 4F). In some embodiments of the present disclosure, the material for configuring the dummy plugs 319 and the dielectric spacer 328 can be silicon oxide, SiC, silicate or the arbitrary combinations thereof.

Figure 4G:
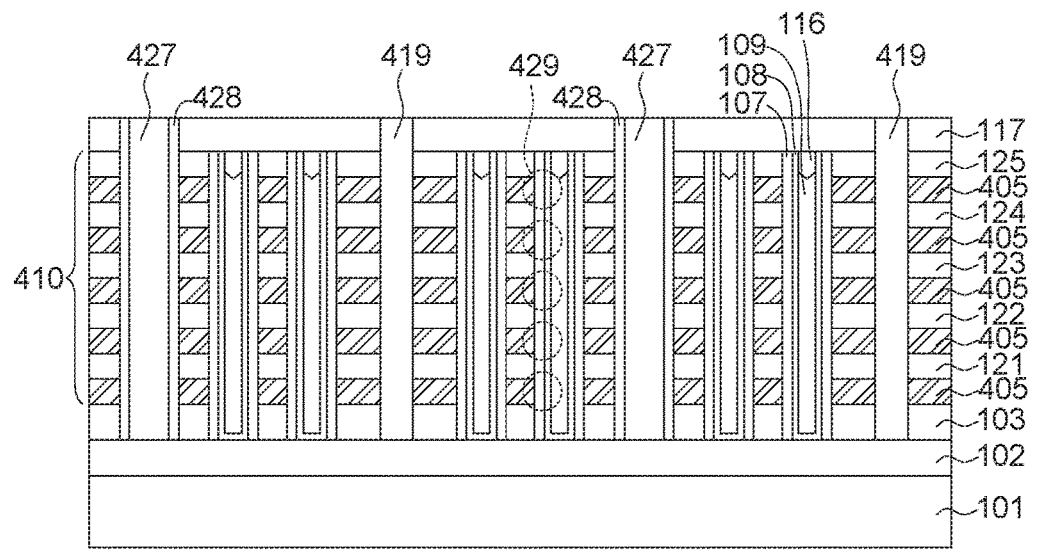

The third through openings 420 are then fulfilled by a conductive material, such as metal (e.g. Ti, W, Al, Cu, Au, Ag or the alloys of these metals), metal oxide (e.g. TiN) or other suitable material, after the portions of the dielectric spacer 428 disposed on the bottom of the third through openings 420, so as to form a contact plug 427 electrically isolated from the second conductive layers 405 by the dielectric spacer 428, and electrically contacting to the first conductive layer 102 in each of the third through openings 420 (see FIG. 4G).

Figure 4H:
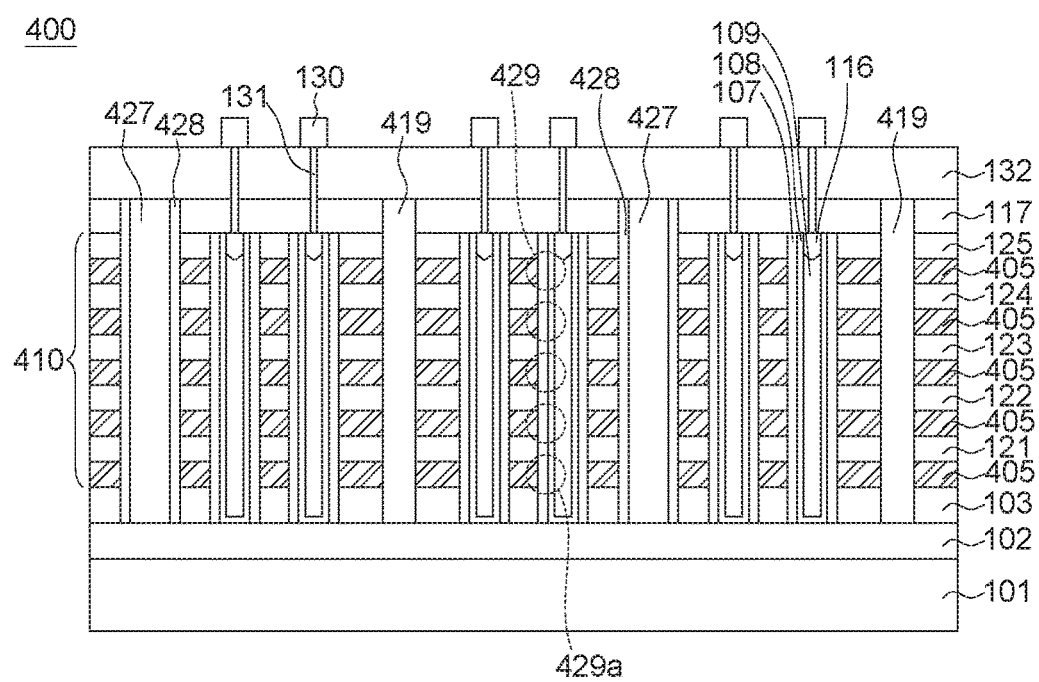

After a series BEOL processes are carried out, an ILD 132 is then formed on the clapping layer 117; a plurality of bit lines 130 electrically connected to the bond pad 116 with an interconnection via 131 are formed on the ILD 132. Meanwhile, the memory device 400 as shown in FIG. 4H can be accomplished. In some embodiments of the present disclosure, the memory cells 429a defined by the bottommost layer of the second conductive layers 105, the memory layer 107 and the channel layer 108 can serve as GST of the memory device 400; the first conductive layer 102 can serve as the bottom common source line of the memory device 400; and other memory cells 429 of the memory cell array can be electrically coupled to a decoder, such as a row decoder or a column decoder (not shown), through the bit lines 130.

Because the material for configuring the dummy plugs 419 is different from that for configuring the contact plugs 427. The dummy plugs 419 that are formed prior to the contact plugs 427, in some embodiments of the present disclosure, may have a stiffness substantially less than that of the contact plugs 427 to serve as a stress buffer for releasing the stress resulted from the process for fabricating the contact plugs 427. In some other embodiment, the dummy plugs 419 may have a stiffness substantially greater than that of the contact plug to serve as an anchor for resisting the stress resulted from the material difference between two adjacent ones of the second conductive layers 405 and the insulating layer 121-125, so as to provide a more stable condition and a greater process window for forming the contact plugs 427 in the multilayers stack 410 subsequently. As a result, the problems due to the aforementioned stress can be avoided, and the operation reliability of the memory device 400 can be improved.

In accordance with the aforementioned embodiments of the present disclosure, a memory device and method for fabricating the same are provided. A multilayers stack having a plurality of insulating layers and a plurality of second conductive layers are formed on a first conductive layer. A memory layer and a channel layer passing through the multilayers stack are formed, so as to define a plurality of memory cells on the intersection points of the memory layer, the channel layer and the second conductive layers. Prior to the forming of at least one contact plug that is formed in the multilayers stack and electrically contacting to the first conductively, a dummy plug is formed in the multilayers stack corresponding the predetermined position for form the contact plug.

Because the material for configuring the dummy plug is different from that for configuring the contact plug. The dummy plug that is formed prior to the contact plug, in some embodiments of the present disclosure, may have a stiffness substantially less than that of the contact plug to serve as a stress buffer for releasing the stress resulted from the process for fabricating the contact plug. In some other embodiment, the dummy plug may have a stiffness substantially greater than that of the contact plug to serve as an anchor for resisting the stress resulted from the material difference between two adjacent ones of the conductive layers and the insulating layers, so as to provide a more stable condition and a greater process window for forming the contact plug in the multilayers stack subsequently. As a result, the problems due to the aforementioned stress can be avoided, and the operation reliability of the memory device can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a semiconductor substrate;
   a first conductive layer, disposed on the semiconductor substrate;
   a plurality insulating layers, disposed on the first conductive layer;
   a plurality of second conductive layers, alternatively stacked with the insulating layers and insulated from the first conductive layer;
   at least one contact plug comprising a first conductive material, passing through the insulating layers and the second conductive layers, insulated from the second conductive layers and electrically contacting to the first conductive layer; and
   at least one dummy plug, formed in an opening passing through a bottommost layer of the insulating layers and the second conductive layers, corresponding to the at least one contact plug, wherein the at least one dummy plug comprises a dielectric isolation layer formed on a sidewall and a bottom of the opening and a second conductive material fully filling the opening and insulated from the second conductive layers and the first conductive layer.

2. The memory device according to claim 1, further comprising:
   a channel layer, disposed on at least one sidewall of at least one first through opening passing through the insulating layers and the second conductive layers; and
   a memory layer, disposed between the channel layer and the second conductive layers.

3. The memory device according to claim 2, wherein the memory layer comprises an oxide-nitride-oxide (ONO) structure disposed on the sidewall of the first through opening and between the second conductor layers and the channel layer.

4. The memory device according to claim 1, wherein the at least one dummy plug has a material different from that for configuring the at least one contact plug.

5. The memory device according to claim 1, wherein the first conductive material is different from the second conductive material.

6. The memory device according to claim 1, wherein the dielectric isolation layer is disposed between the second conductive material and the second conductive layers.

7. The memory device according to claim 1, further comprising a dielectric spacer disposed between the at least one contact plug and the second conductive layers.

8. The memory device according to claim 5, wherein the first conductive material is selected from a group consisting of Ti, W, Al, Cu, Au, Ag, TiN and arbitrary combinations thereof, and the second conductive material comprises poly-silicon.

* * * * *